(12) United States Patent
Fukatsu et al.

(10) Patent No.: US 11,961,744 B2
(45) Date of Patent: Apr. 16, 2024

(54) SUBSTRATE PROCESSING APPARATUS AND SUBSTRATE PROCESSING METHOD

(71) Applicant: SCREEN Holdings Co., Ltd., Kyoto (JP)

(72) Inventors: Eiji Fukatsu, Kyoto (JP); Koji Hashimoto, Kyoto (JP); Hiroyuki Fujiki, Kyoto (JP); Masafumi Inoue, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 772 days.

(21) Appl. No.: 16/978,221

(22) PCT Filed: Feb. 1, 2019

(86) PCT No.: PCT/JP2019/003665
§ 371 (c)(1),
(2) Date: Sep. 4, 2020

(87) PCT Pub. No.: WO2019/171846
PCT Pub. Date: Sep. 12, 2019

(65) Prior Publication Data
US 2021/0013059 A1    Jan. 14, 2021

(30) Foreign Application Priority Data
Mar. 9, 2018   (JP) ................. 2018-042838

(51) Int. Cl.
*H01L 21/67* (2006.01)
*H01L 21/677* (2006.01)

(52) U.S. Cl.
CPC .. *H01L 21/67051* (2013.01); *H01L 21/67248* (2013.01); *H01L 21/67766* (2013.01)

(58) Field of Classification Search
CPC ......... H01L 21/67051; H01L 21/67248; H01L 21/67253; H01L 21/67288;
(Continued)

(56) References Cited

U.S. PATENT DOCUMENTS 11,139,180 B2 * 10/2021 Yoshihara ......... H01L 21/67253
2008/0142500 A1   6/2008 Tomita et al. ............. 219/444.1
(Continued)

FOREIGN PATENT DOCUMENTS

CN     101002304 A     7/2007
CN     103367203 A     10/2013
(Continued)

OTHER PUBLICATIONS

Office Action dated Jun. 28, 2022 of corresponding Korean Patent Application No. 10-2020-7024028 with translation.
(Continued)

*Primary Examiner* — Jasmine J Clark
(74) *Attorney, Agent, or Firm* — OSTROLENK FABER LLP

(57) ABSTRACT

In a chamber, first processing is performed as preliminary processing. After the first processing has been finished, the temperature in a predetermined target region in the chamber is measured with a thermographic camera. Then, whether or not to start second processing on a substrate is determined in accordance with the acquired measured temperature information. If it is determined as a result that the second processing can be started, the second processing is performed. In this case, the second processing on the substrate can be started, with the temperature of the target region in the chamber having reached its stability. Accordingly, the second processing can be performed uniformly on a plurality of substrates. That is, it is possible to reduce variations in processing caused by temperature environments in the chamber.

16 Claims, 12 Drawing Sheets

(58) Field of Classification Search
CPC ......... H01L 21/67103; H01L 21/68742; H01L 21/67028; H01L 21/6715; H01L 21/02041; H01L 21/02057; H01L 21/6875; H01L 21/67034; H01L 21/68721; H01L 21/02082; H01L 21/02054; H01L 21/6708; H01L 22/12; H01L 22/20
USPC .......................................................... 438/16
See application file for complete search history.

(56) References Cited

U.S. PATENT DOCUMENTS

| | | | |
|---|---|---|---|
| 2013/0260570 A1 | 10/2013 | Masuhara et al. ............ | 438/747 |
| 2015/0273534 A1 | 10/2015 | Ootagaki et al. | |
| 2015/0328668 A1 | 11/2015 | Koyama et al. | |

FOREIGN PATENT DOCUMENTS

| | | |
|---|---|---|
| CN | 104952771 A | 9/2015 |
| JP | H04-348513 A | 12/1992 |
| JP | H10-156261 A | 6/1998 |
| JP | H11-165114 A | 6/1999 |
| JP | 2000-223435 A | 8/2000 |
| JP | 2002-316080 A | 10/2002 |
| JP | 2002-343711 A | 11/2002 |
| JP | 2004-115904 A | 4/2004 |
| JP | 2010-040921 A | 2/2010 |
| JP | 2011-211092 A | 10/2011 |
| JP | 2012-049153 A | 3/2012 |
| JP | 2013-074090 A | 4/2013 |
| JP | 2015-185824 A | 10/2015 |
| JP | 2015-191895 A | 11/2015 |
| JP | 2015-220318 A | 12/2015 |
| JP | 2017-201723 A | 11/2017 |
| TW | 201709369 A | 3/2017 |
| WO | WO 2015/037035 A1 | 3/2015 |

OTHER PUBLICATIONS

Notice of Reasons for Refusal dated Aug. 24, 2021 in corresponding Japanese Patent Application No. JP 2018-042838, along with an English machine translation.
International Search Report dated Apr. 16, 2019 in corresponding PCT International Application No. PCT/JP2019/003665.
Written Opinion dated Apr. 16, 2019 in corresponding PCT International Application No. PCT/JP2019/003665.
Office Action dated Aug. 6, 2019 in corresponding Taiwanese Patent Application No. 108107703.
Notice of Reasons for Refusal dated Mar. 22, 2022 in corresponding Japanese Patent Application No. JP 2018-042838, along with an English machine translation.
Notice of Reasons for Refusal dated Aug. 1, 2023 issued in corresponding Japanese Patent Application No. 2022-175381.
Office Action dated Feb. 3, 2024, issued in corresponding Chinese Patent Application No. 201980014804.8.
Search Report dated Feb. 3, 2024, issued in corresponding Chinese Patent Application No. 201980014804.8.

* cited by examiner

SUBSTRATE PROCESSING APPARATUS AND SUBSTRATE PROCESSING METHOD

CROSS-REFERENCE TO RELATED APPLICATIONS

The present application is a 35 U.S.C. §§ 371 national phase conversion of International Application No. PCT/JP2019/003665, filed Feb. 1, 2019, which claims priority to Japanese Patent Application No. 2018-042838, filed Mar. 9, 2018, the contents of both of which are incorporated herein by reference. The PCT International Application was published in the Japanese language.

TECHNICAL FIELD

The present invention relates to a substrate processing apparatus and a substrate processing method both for processing substrates in a chamber.

BACKGROUND ART

A substrate processing apparatus that supplies processing liquids to substrates has conventionally been used in the process of manufacturing semiconductor wafers. The substrate processing apparatus holds substrates inside a chamber and supplies processing liquids such as a photoresist liquid, an etchant, a cleaning liquid, and pure water to substrates. Such a substrate processing apparatus makes various measurements in the chamber in order to keep constant the quality of processing on substrates.

For example, the apparatus disclosed in Patent Literature (PTL) 1 captures an image of whether processing liquids have been ejected to substrates, with a camera. The apparatus disclosed in PTL 2 detects temperature distributions on substrate surfaces with a radiation thermometer.

CITATION LIST

Patent Literatures

[PTL 1] Japanese Patent Application Laid-Open No. 2002-316080
[PTL 2] Japanese Patent Application Laid-Open No. H11-165114

SUMMARY OF INVENTION

Technical Problem

Around a substrate to be processed in the chamber of the substrate processing apparatus, there are various members such as a base for holding the substrate, nozzles for ejecting processing liquids to the substrate, a cup that surrounds the substrate, and the inner wall face of the chamber. The surface temperatures of these members may affect the quality of processing on the substrate. Hence, if the surface temperature of each member in the chamber changes during the process of sequentially processing a plurality of substrates, variations may be caused in the quality of processing on the substrates.

The present invention has been made in view of such circumstances, and it is an object of the present invention to provide a substrate processing apparatus and a substrate processing method capable of reducing variations in processing caused by temperature environments in the chamber.

Solution to Problem

In order to solve the above-described problem, a first aspect of the present invention includes a chamber, a substrate holder that holds a substrate in the chamber, a first processor that performs first processing in the chamber, a second processor that performs second processing on a substrate held by the substrate holder in the chamber after the first processing, a first temperature measurement part that measures a temperature of a predetermined target region in the chamber, and a controller that controls the first processor and the second processor. The controller determines whether or not to start the second processing in accordance with measured temperature information acquired from the first temperature measurement part during or after the first processing.

A second aspect of the present invention is the substrate processing apparatus according to the first aspect, in which the controller determines whether or not to start the second processing in accordance with the measured temperature information and reference temperature information stored in the controller.

A third aspect of the present invention is the substrate processing apparatus according to the first or second aspect, in which when having determined after the first processing that the second processing cannot be started, the controller causes the first processor to additionally perform the first processing and again determines whether or not to start the second processing, in accordance with measured temperature information acquired from the first temperature measurement part during or after the first processing that is additionally performed.

A fourth aspect of the present invention is the substrate processing apparatus according to the first or second aspect that further includes an insertion processor that performs insertion processing different from the first processing in the chamber. When having determined after the first processing that the second processing cannot be started, the controller causes the insertion processor to perform the insertion processing and again determines whether or not to start the second processing, in accordance with measured temperature information acquired from the first temperature measurement part during or after the insertion processing.

A fifth aspect of the present invention is the substrate processing apparatus according to any one of the first to fourth aspects, in which the target region includes two or more parts that play different roles in the chamber.

A sixth aspect of the present invention is the substrate processing apparatus according to any one of the first to fifth aspects, in which the target region includes at least part of the substrate holder.

A seventh aspect of the present invention is the substrate processing apparatus according to any one of the first to sixth aspects, in which the target region includes at least part of the second processor.

An eighth aspect of the present invention is the substrate processing apparatus according to any one of the first to seventh aspects that further includes a ring-shaped cup that surrounds the substrate holder. The target region includes at least part of the cup.

A ninth aspect of the present invention is the substrate processing apparatus according to any one of the first to eighth aspects, in which the second processor includes a nozzle that ejects a processing liquid toward a substrate, and the target region includes a liquid column of the processing liquid ejected from the nozzle.

A tenth aspect of the present invention is the substrate processing apparatus according to the ninth aspect that further includes a second temperature measurement part that measures a temperature of a processing liquid supplied to the nozzle in piping. The controller determines whether or not to start the second processing, in accordance with the measured temperature information acquired from the first temperature measurement part and measured temperature information acquired from the second temperature measurement part.

An eleventh aspect of the present invention is the substrate processing apparatus according to any one of the first to tenth aspects, in which the first processing is the same processing as the second processing and is performed on a dummy substrate that has the same shape as a substrate that is subjected to the second processing.

A twelfth aspect of the present invention is the substrate processing apparatus according to any one of the first to eleventh aspects, in which the first temperature measurement part is a thermographic camera.

A thirteenth aspect of the present invention is the substrate processing apparatus according to any one of the first to eleventh aspects, in which the first temperature measurement part includes a radiation thermometer, and an oscillating mechanism that changes an orientation of the radiation thermometer.

A fourteenth aspect of the present invention is the substrate processing apparatus according to any one of the first to eleventh aspects, in which the first temperature measurement part is a thermocouple disposed in the target region.

A fifteenth aspect of the present invention is a substrate processing method for processing a substrate in a chamber. The method includes the steps of a) performing first processing in the chamber, b) measuring a temperature of a predetermined target region in the chamber during or after the first processing, c) determining whether or not to start second processing on a substrate, in accordance with measured temperature information acquired in the step b), and d) when it is determined in the step c) that the second processing can be started, performing the second processing.

A sixteenth aspect of the present invention is the substrate processing method according to the fifteenth aspect, in which in the step c), in the step c), whether or not to start the second processing is determined in accordance with the measured temperature information and reference temperature information stored in advance.

Advantageous Effects of Invention

According to the first to sixteenth aspects of the present invention, it is possible to start the second processing on the substrate, with the temperature of the target region in the chamber having reached its stability. Accordingly, the second processing can be performed uniformly on a plurality of substrates.

In particular, according to the third aspect of the present invention, the first processing is additionally performed when the temperature in the chamber has not reached the state of being able to start the second processing. This allows temperature environments in the chamber to approach the state of being able to start the second processing.

In particular, according to the fourth aspect of the present invention, the insertion processing different from the first processing is performed when the temperature in the chamber has not reached the state of being able to start the second processing. This allows temperature environments in the chamber to approach the state of being able to start the second processing.

In particular, according to the fifth aspect of the present invention, whether or not to start the second processing can be determined with higher precision by including two or more parts that have different roles in the target region whose temperature is to be measured.

In particular, according to the tenth aspect of the present invention, whether or not to start the second processing can be determined with higher precision by using the measured temperature information acquired from the first temperature measurement part and the measured temperature information acquired from the second temperature measurement part.

DESCRIPTION OF EMBODIMENTS

Embodiments of the present invention will be described hereinafter with reference to the drawings.

Figure 1:
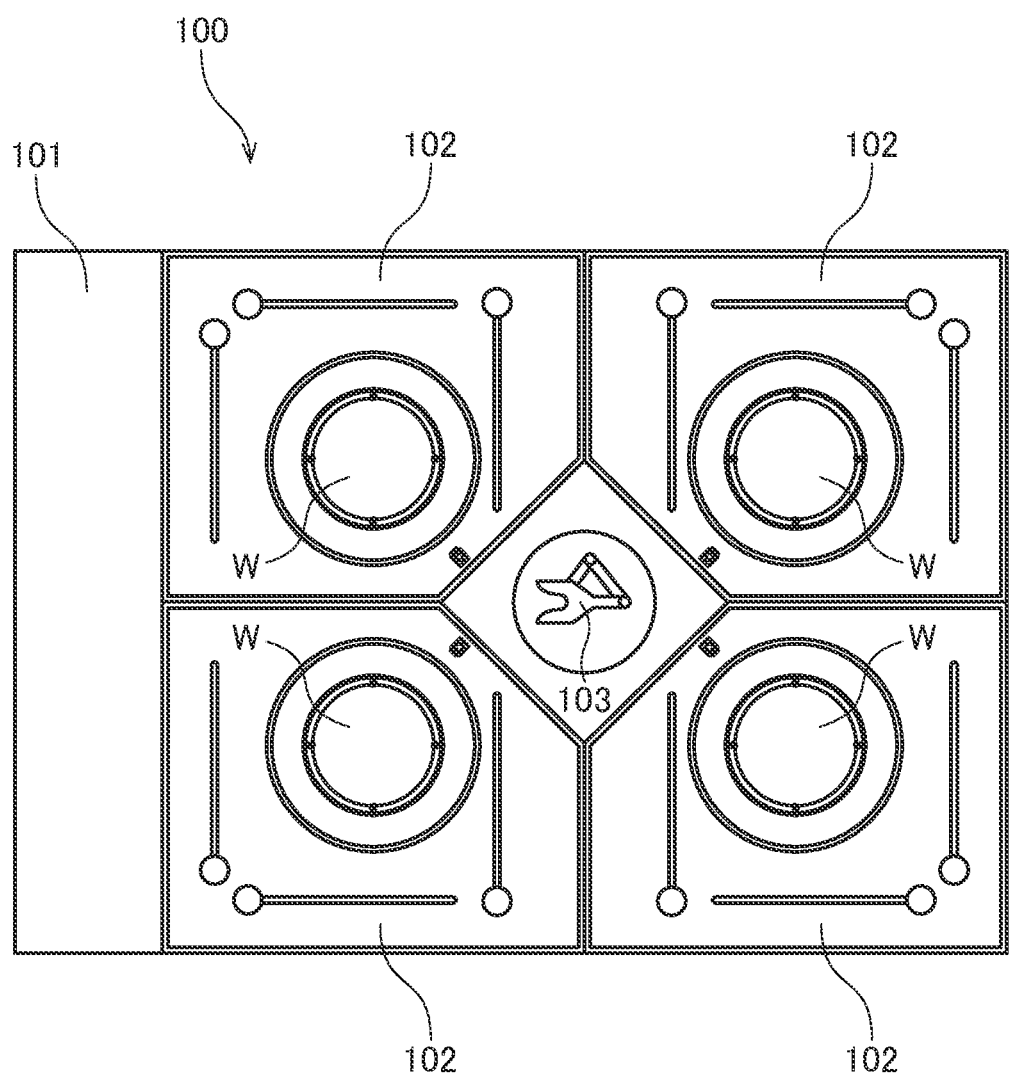
FIG. 1 is a plan view of a substrate processing apparatus.

1. First Embodiment 1-1. Overall Configuration of Substrate Processing Apparatus FIG. 1 is a plan view of a substrate processing apparatus 100 according to a first embodiment of the present invention. This substrate processing apparatus 100 is an apparatus that supplies processing liquids to disk-shaped substrates W (silicon substrates) and processes surfaces of the substrates in the process of manufacturing semiconductor wafers. As illustrated in FIG. 1, the substrate processing apparatus 100 includes an indexer 101, a plurality of processing units 102, and a main transport robot 103.

The indexer 101 is a part that transports unprocessed substrates W from the outside into the apparatus and transports processed substrates W to the outside of the apparatus. The indexer 101 includes a plurality of carriers disposed so as to house a plurality of substrates W. The indexer 101 also includes a transfer robot, which is not shown. The transfer robot transfers the substrates W between the carriers in the indexer 101 and the processing units 102 or the main transport robot 103. For example, commonly known front opening unified pods (FOUPs) or standard mechanical interface (SMIF) pods that house the substrates W in an enclosed space, or open cassettes (OCs) that house the substrates W in contact with the outside air are used as the carriers.

The processing units 102 are so-called single-wafer processors that process the substrates W one by one. The processing units 102 are disposed around the main transport robot 103. In the present embodiment, four processing units 102 disposed around the main transport robot 103 are stacked in three layers in a height direction. That is, the substrate processing apparatus 100 according to the present embodiment includes twelve processing units 102 in total. The substrates W are parallel-processed in each processing unit 102. The number of processing units 102 included in the substrate processing apparatus 100 is, however, not limited to twelve, and may be 24, 8, 4, or 1, for example.

The main transport robot 103 is a mechanism for transporting the substrates W between the indexer 101 and the processing units 102. The main transport robot 103 includes, for example, a hand that holds the substrates W and an arm that moves the hand. The main transport robot 103 takes unprocessed substrates W out of the indexer 101 and transports the substrates W to the processing units 102. When the processing units 102 have completed the processing on the substrates W, the main transport robot 103 takes the processed substrates W out of the processing units 102 and transports the substrates W to the indexer 101.

1-2. Configuration of Processing Unit

Next, the configuration of the processing units 102 will be described. Although the following description is given of one of the processing units 102 in the substrate processing apparatus 100, the other processing units 102 also have an equivalent configuration.

Figure 2:
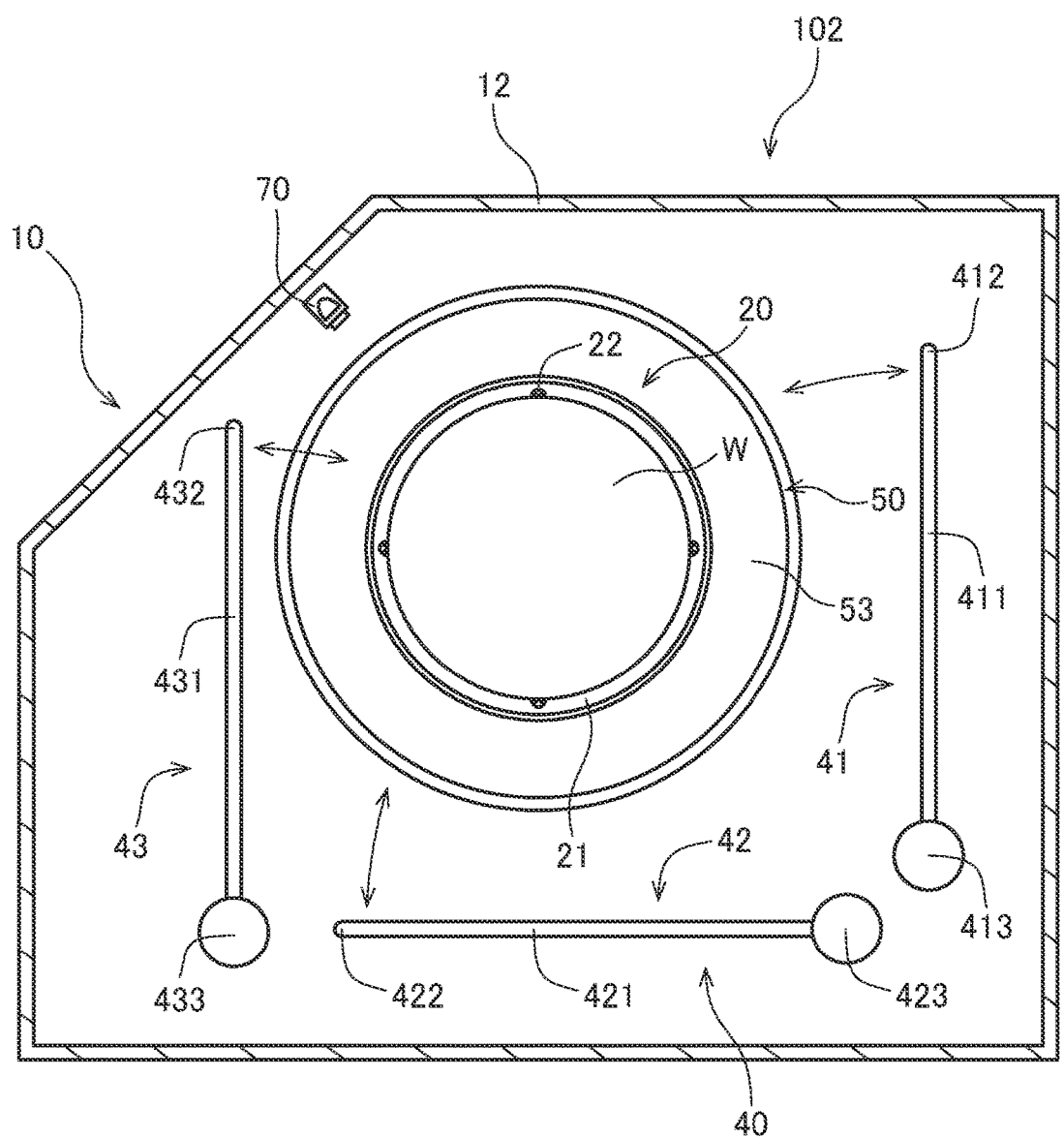
FIG. 2 is a plan view of a processing unit.
Figure 3:
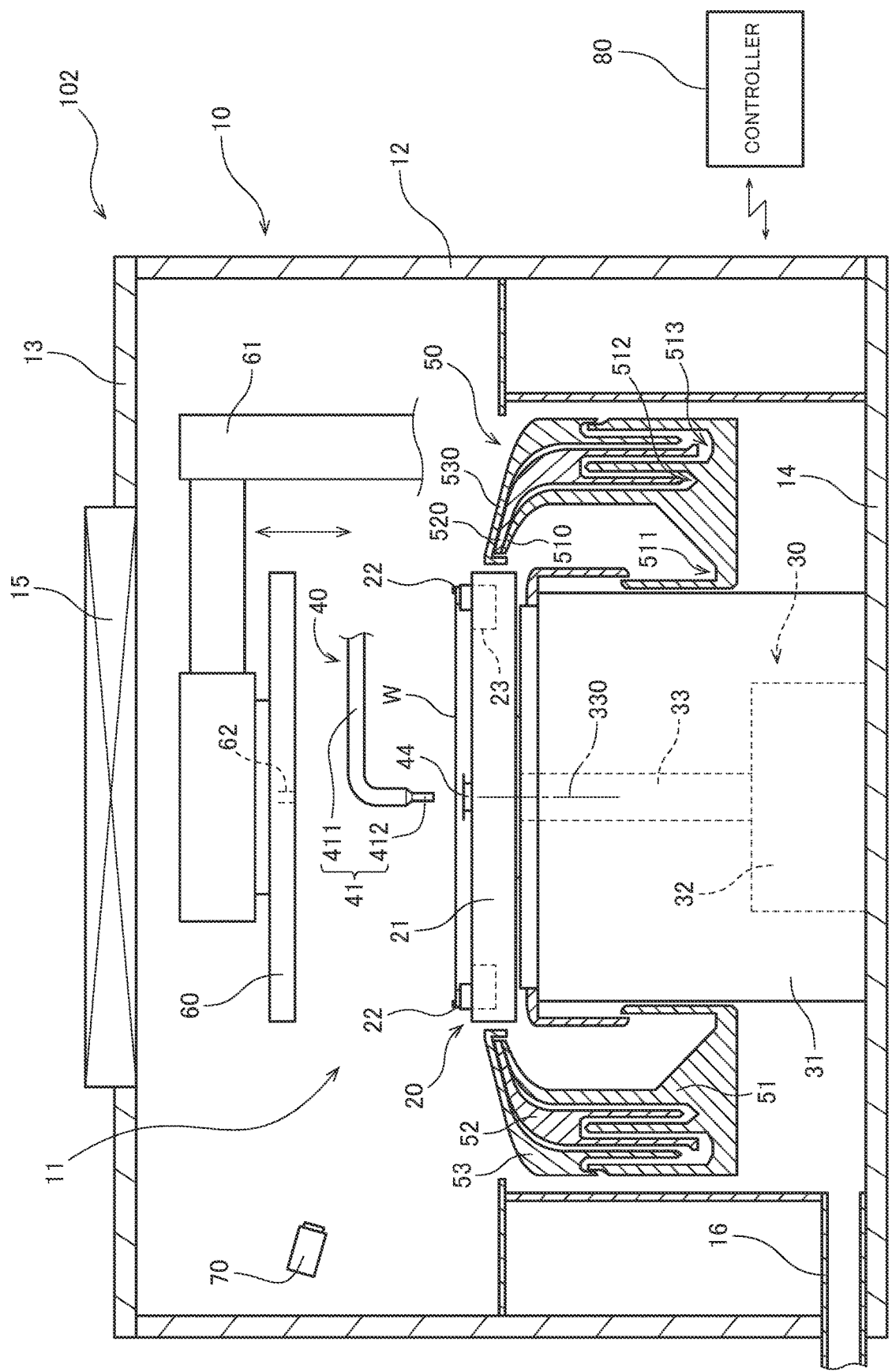
FIG. 3 is a longitudinal sectional view of the processing unit.

FIG. 2 is a plan view of one processing unit 102. FIG. 3 is a longitudinal sectional view of the processing unit 102. As illustrated in FIGS. 2 and 3, the processing unit 102 includes a chamber 10, a substrate holder 20, a rotation mechanism 30, a processing liquid supply part 40, a processing liquid collector 50, a barrier plate 60, a thermographic camera 70, and a controller 80.

The chamber 10 is a casing that has a processing space 11 for processing a substrate W. The chamber 10 has a side wall 12 that surrounds the side portion of the processing space 11, a top portion 13 that covers the top of the processing space 11, and a bottom portion 14 that convers the bottom of the processing space 11. The substrate holder 20, the rotation mechanism 30, the processing liquid supply part 40, the processing liquid collector 50, the barrier plate 60, and the thermographic camera 70 are housed inside the chamber 10. The side wall 12 has, in part, a transport entrance for transporting the substrate W into and out of the chamber 10 and a shutter that opens and closes the transport entrance, both of which are not shown.

As illustrated in FIG. 3, a fan filter unit (FFU) 15 is provided in the top portion 13 of the chamber 10. The fan filter unit 15 includes a dust collector filter such as an HEPA filter, and a fan that produces an air stream. When the fan filter unit 15 is operated, the air in the clean room installed in the substrate processing apparatus 100 is taken into the fan filter unit 15, cleaned by the dust collector filter, and supplied to the processing space 11 of the chamber 10. This forms a downflow of the clean air in the processing space 11 of the chamber 10.

The lower portion of the side wall 12 is connected in part to an exhaust duct 16. The air supplied from the fan filter unit 15 forms a downflow in the chamber 10 and is then exhausted through the exhaust duct 16 to the outside of the chamber 10.

The substrate holder 20 is a mechanism for holding a substrate W in a horizontal position (in a position in which the normal is oriented in the vertical direction) in the chamber 10. As illustrated in FIGS. 2 and 3, the substrate holder 20 includes a disk-shaped spin base 21 and a plurality of chuck pins 22. The chuck pins 22 are provided at equiangular intervals along the outer periphery of the upper face of the spin base 21. The substrate W is held by the chuck pins 22, with its to-be-processed surface where a pattern is formed facing upward. Each chuck pin 22 comes in contact with the lower face of the edge portion of the substrate W and the outer peripheral end face of the substrate W and supports the substrate W at an upper position that is slightly spaced from the upper face of the spin base 21.

Inside the spin base 21, a chuck pin switching mechanism 23 is provided to switch the positions of the chuck pins 22. The chuck pin switching mechanism 23 switches the positions of the chuck pins 22 between chucking positions at which the chuck pins 22 hold the substrate W and dechucking positions at which the chuck pins 22 release the hold of the substrate W.

The rotation mechanism 30 is a mechanism for rotating the substrate holder 20. The rotation mechanism 30 is housed inside a motor cover 31 provided below the spin base 21. As indicated by broken lines in FIG. 3, the rotation mechanism 30 includes a spin motor 32 and a support shaft 33. The support shaft 33 extends in the vertical direction and is connected at its lower end to the spin motor 32 and fixed at its upper end to the center of the lower face of the spin base 21. When the spin motor 32 is driven, the support shaft 33 rotates about a shaft core 330. Along with the support shaft 33, the substrate holder 20 and the substrate W held by and the substrate holder 20 also rotate about the shaft core 330.

The processing liquid supply part 40 is a mechanism for supplying processing liquids to the upper face of the substrate W held by the substrate holder 20. As illustrated in FIGS. 2 and 3, the processing liquid supply part 40 includes a first top nozzle 41, a second top nozzle 42, a third top nozzle 43, and a bottom nozzle 44.

The first top nozzle 41 includes a first nozzle arm 411, a first nozzle head 412 provided at the tip end of the first nozzle arm 411, and a first nozzle motor 413. The second top nozzle 42 includes a second nozzle arm 421, a second nozzle head 422 provided at the tip end of the second nozzle arm 421, and a second nozzle motor 423. The third top nozzle 43 includes a third nozzle arm 431, a third nozzle head 432 provided at the tip end of the third nozzle arm 431, and a third nozzle motor 433.

When the nozzle motors 413, 423, and 433 are driven, the nozzle arms 411, 421, and 431 individually turn in the horizontal direction about the base ends of the nozzle arms 411, 421, and 431, respectively, as indicated by arrows in FIG. 2. This allows each of the nozzle heads 412, 422, and 432 to become movable between its processing position and its retracted position. At the processing position, each of the nozzle heads 412, 422, and 432 is located above the substrate W held by the substrate holder 20. At the retracted position, each of the nozzle heads 412, 422, and 432 is located outward of the processing liquid collector 50. In FIG. 2, the nozzle heads 412, 422, and 432 located at the retracted positions are illustrated.

Figure 4:
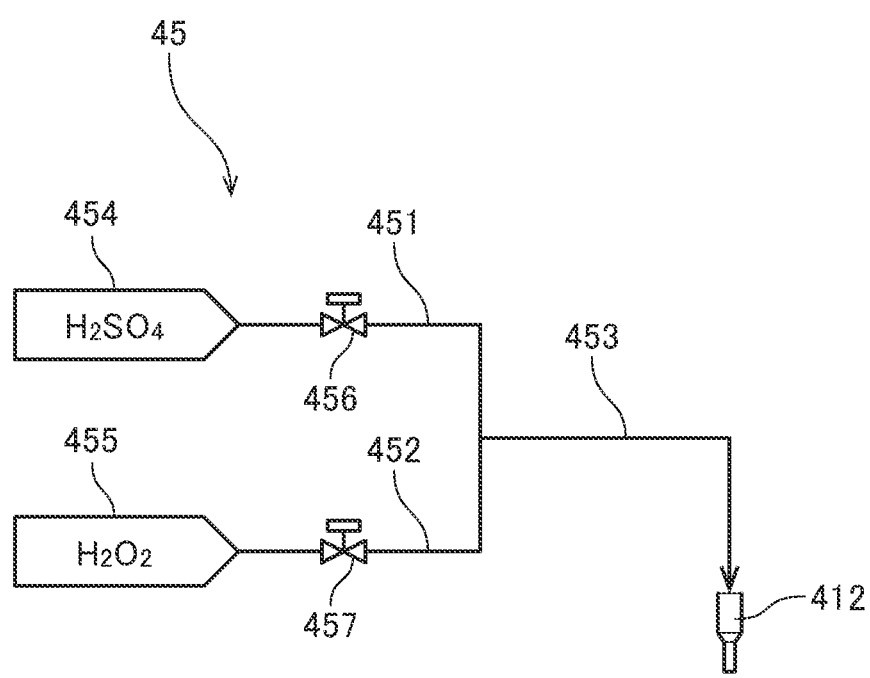
FIG. 4 is a diagram illustrating an example of a liquid supply part connected to a first nozzle head.

Each of the nozzle heads 412, 422, and 432 is individually connected to a liquid supply part for supplying a processing liquid. FIG. 4 is a diagram illustrating one example of a liquid supply part 45 connected to the first nozzle head 412. FIG. 4 takes an example of the case where a liquid mixture of a sulfuric acid and a hydrogen peroxide solution, i.e., an SPM cleaning liquid, is supplied as the processing liquid.

The liquid supply part 45 in FIG. 4 includes first piping 451, second piping 452, and junction piping 453. The upstream end of the first piping 451 is connected through a flow path to a sulfuric acid supply source 454. The upstream end of the second piping 452 is connected through a flow path to a hydrogen peroxide solution supply source 455. The downstream ends of the first piping 451 and the second piping 452 are both connected through flow paths to the junction piping 453. The downstream end of the junction piping 453 is connected through a flow path to the first nozzle head 412. In the middle of the path of the first piping 451, a first valve 456 is interpolated. In the middle of the path of the second piping 452, a second valve 457 is interpolated.

If the first valve 456 and the second valve 457 are opened when the first nozzle head 412 is located at the processing position, the sulfuric acid supplied from the sulfuric acid supply source 454 to the first piping 451 and the hydrogen peroxide solution supplied from the hydrogen peroxide solution supply sauce 455 to the second piping 452 merge together at the junction piping 453 into the SPM cleaning liquid. The SPM cleaning liquid is heated to a high temperature (e.g., in the range of 150 to 200° C.) by a heater (not shown). The high-temperature SPM cleaning liquid is then ejected from the first nozzle head 412 toward the upper face of the substrate W held by the substrate holder 20.

The first nozzle head 412, the second nozzle head 422, and the third nozzle head 432 eject different processing liquids. Examples of the processing liquids include, in addition to the aforementioned SPM cleaning liquid, an SC-1 cleaning liquid (a liquid mixture of aqueous ammonia, a hydrogen peroxide solution, and pure water), an SC-2 cleaning liquid (a liquid mixture of an hydrochloric acid, a hydrogen peroxide solution, and pure water), a DHF cleaning liquid (dilute hydrofluoric acid), and pure water (deionized water).

Note that some of the first nozzle head 412, the second nozzle head 422, and the third nozzle head 432 may be so-called two-fluid nozzles that mix a processing liquid and a pressurized gas into droplets and injects a mixed fluid of the droplets and a gas to the substrate W. The number of top nozzles provided in each processing unit 102 is not limited to three, and may be one, two, or four or more.

The bottom nozzle 44 is disposed inward of a through hole formed in the center of the spin base 21. The bottom nozzle 44 has an ejection port that opposes the lower face of the substrate W held by the substrate holder 20. The bottom nozzle 44 is also connected to a liquid supply part for supplying a processing liquid. When a processing liquid is supplied from the liquid supply part to the bottom nozzle 44, the processing liquid is ejected from the bottom nozzle 44 toward the lower face of the substrate W.

The processing liquid collector 50 is a part that collects spent processing liquids. As illustrated in FIG. 3, the processing liquid collector 50 includes an inner cup 51, an intermediate cup 52, and an outer cup 53. The inner cup 51, the intermediate cup 52, and the outer cup 53 are vertically movable independently of one another by an elevating mechanism not shown.

The inner cup 51 includes an annular ring-shaped first guide plate 510 that surrounds the periphery of the substrate holder 20. The intermediate cup 52 includes an annular ring-shaped second guide plate 520 located above and outward of the first guide plate 510. The outer cup 53 includes an annular ring-shaped third guide plate 530 located above and outward of the second guide plate 520. The bottom of the inner cup 51 extends to the undersides of the intermediate cup 52 and the outer cup 53. In the upper face of the bottom, a first drain groove 511, a second drain groove 512, and a third drain groove 513 are provided in this order from the inside.

The processing liquids ejected respectively from the nozzles 41, 42, 43, and 44 of the processing liquid supply part 40 are supplied to the substrate W and then dispersed outward by centrifugal forces due to the rotation of the substrate W. The processing liquids dispersed from the substrate W is collected by one of the first guide plate 510, the second guide plate 520, and the third guide plate 530. The processing liquids collected by the first guide plate 510 are discharged through the first drain groove 511 to the outside of the processing unit 102. The processing liquids collected by the second guide plate 520 are discharged through the second drain groove 512 to the outside of the processing unit 102. The processing liquids collected by the third guide plate 530 are discharged through the third drain groove 513 to the outside of the processing unit 102.

In this way, the processing unit 102 includes a plurality of exhaust paths for processing liquids. This allows the processing liquids supplied to the substrate W to be classified and collected depending on the type. Accordingly, the disposal and regeneration of the collected processing liquids can also be conducted separately depending on the property of each processing liquid.

The barrier plate 60 is a member for suppressing diffusion of a gas in the vicinity of the surface of the substrate W during some processing such as dry processing. The barrier plate 60 has a disk-shaped outside shape. The barrier plate 60 is disposed in a horizontal position above the substrate holder 20. As illustrated in FIG. 3, the barrier plate 60 is connected to an elevating mechanism 61. When the elevating mechanism 61 is operated, the barrier plate 60 is moved up and down between its upper position and its lower position. At the upper position, the barrier plate 60 is spaced above from the upper face of the substrate W held by the substrate holder 20. At the lower position, the barrier plate 60 is located closer to the upper face of the substrate W than at the upper position. In FIG. 3, the barrier plate 60 located at the upper position is illustrated. The elevating mechanism 61 is, for example, a mechanism for converting rotational motion of a motor into rectilinear motion by a ball screw.

The lower face of the barrier plate 60 has a gas outlet 62 for blowing a gas for drying (hereinafter, referred to as a "dry gas") in the center. The gas outlet 62 is connected to a gas supply part (not shown) that supplies the dry gas. The dry gas is, for example, a heated nitrogen gas.

When a processing liquid is supplied from the first top nozzle 41, the second top nozzle 42, or the third top nozzle 43 to the substrate W, the barrier plate 60 retracts into the upper position. When dry processing is performed on the substrate W after the supply of the processing liquid, the barrier plate 60 is moved down to the lower position by the elevating mechanism 61. Then, the dry gas brows from the gas outlet 62 toward the upper face of the substrate W. At this time, the barrier plate 60 prevents diffusion of the gas. As a result, the dry gas is supplied efficiently to the upper face of the substrate W.

Figure 5:
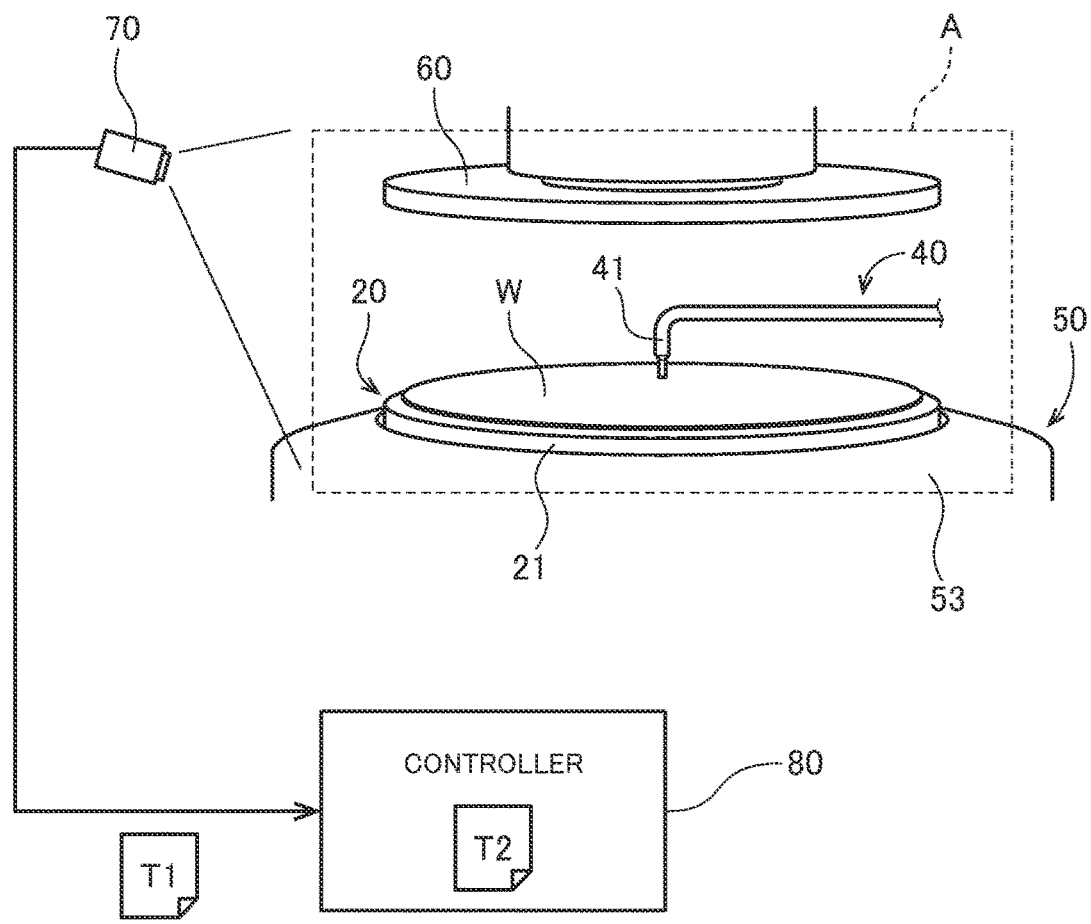
FIG. 5 is a diagram schematically illustrating a temperature measurement using a thermographic camera.

The thermographic camera 70 is a device (first temperature measurement part) that measures the temperature of a predetermined target region A in the chamber 10 and acquires measured temperature information T1. The thermographic camera 70 is, for example, installed at a position close to the inner face of the side wall 12 of the chamber 10. FIG. 5 is a diagram schematically illustrating a temperature measurement using the thermographic camera 70. The thermographic camera 70 detects infrared rays radiated from each member included in the target region A and, on the basis of the result of the detection, acquires the measured temperature information T1 that images the temperature distribution in the target region A. The measured temperature information T1 acquired by the thermographic camera 70 is transmitted from the thermographic camera 70 to the controller 80.

The target region A may include the chamber 10 (i.e., the inner surface of the side wall 12), the substrate holder 20 (e.g., the surface of the spin base 21 and the surfaces of the chuck pins 22), the rotation mechanism 30 (e.g., the surface of the motor cover 31), the processing liquid supply part 40 (e.g., the surfaces of the first top nozzle 41, the second top nozzle 42, and the third top nozzle 43), the processing liquid collector 50 (e.g., the surfaces of the inner cup 51, the intermediate cup 52, and the outer cup 53), and the surface of the barrier plate 60. The target region A may include some or all of these parts. Alternatively, the target region A may include a plurality of regions spaced from each other.

It is preferable that the target region A includes two or more parts that play different roles in the chamber 10. For example, it is preferable that the target region A includes the substrate holder 20 having the function of holding the substrate W and the processing liquid supply part 40 having the function of supplying processing liquids. This allows the thermographic camera 70 to measure the temperatures of a plurality of parts that affect processing on the substrate W. Accordingly, whether or not to start the second processing in step S6, which will be described later, can be determined with higher precision.

It is also preferable that the target region A includes parts that are located in relatively proximity to the substrate W, among a plurality of parts existing in the chamber 10. For example, the target region A may include at least part of the substrate holder 20, at least part of the processing liquid supply part 40, and at least part of the processing liquid collector 50. This allows the thermographic camera 70 to measure the temperatures of parts that greatly affect processing on the substrate W. Accordingly, whether or not to start the second processing in step S6, which will be described later, can be determined with higher precision.

The target region A may also include a liquid column of the processing liquid ejected from the first top nozzle 41, the second top nozzle 42, or the third top nozzle 43. In this case, the thermographic camera 70 can measure the temperature of the processing liquid immediately after ejection that directly affects processing on the substrate W.

Figure 6:
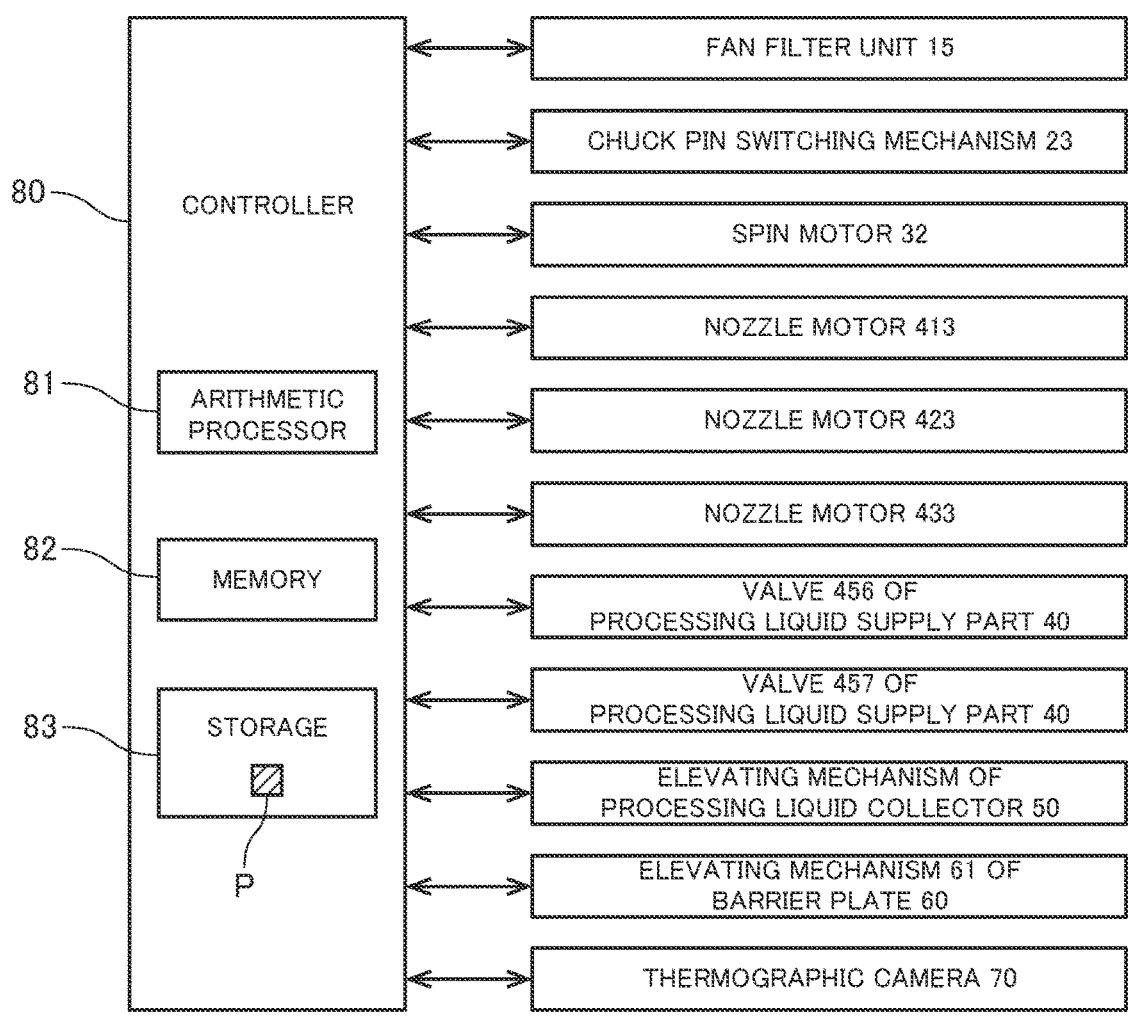
FIG. 6 is a block diagram illustrating connections between a controller and each part in the processing unit.

The controller 80 is means for controlling the operation of each part in the processing unit 102. FIG. 6 is a block diagram illustrating connection of the controller 80 and each part in the processing unit 102. As illustrated schematically in FIG. 6, the controller 80 is configured as a computer that includes an arithmetic processor 81 such as a CPU, a memory 82 such as a RAM, and a storage 83 such as a hard disk drive. The storage 83 has installed therein a computer program P for executing processing on a substrate W in the processing unit 102.

As illustrated in FIG. 6, the controller 80 is communicably connected via wire or wireless to each of the fan filter unit 15, the chuck pin switching mechanism 23, the spin motor 32, the nozzle motors 413, 423, and 433, the valves 456 and 457 of the processing liquid supply part 40, the elevating mechanism of the processing liquid collector 50, the elevating mechanism 61 of the barrier plate 60, and the thermographic camera 70 described above. The controller 80 controls the operations of the above-described parts by temporarily reading out data or the computer program P stored in the storage 83 into the memory 82 and causing the arithmetic processor 81 to perform arithmetic processing in accordance with the computer program P. Accordingly, processing from steps S1 to S13 proceeds, which will be described later.

1-3. Operations of Processing Unit

Figure 7:
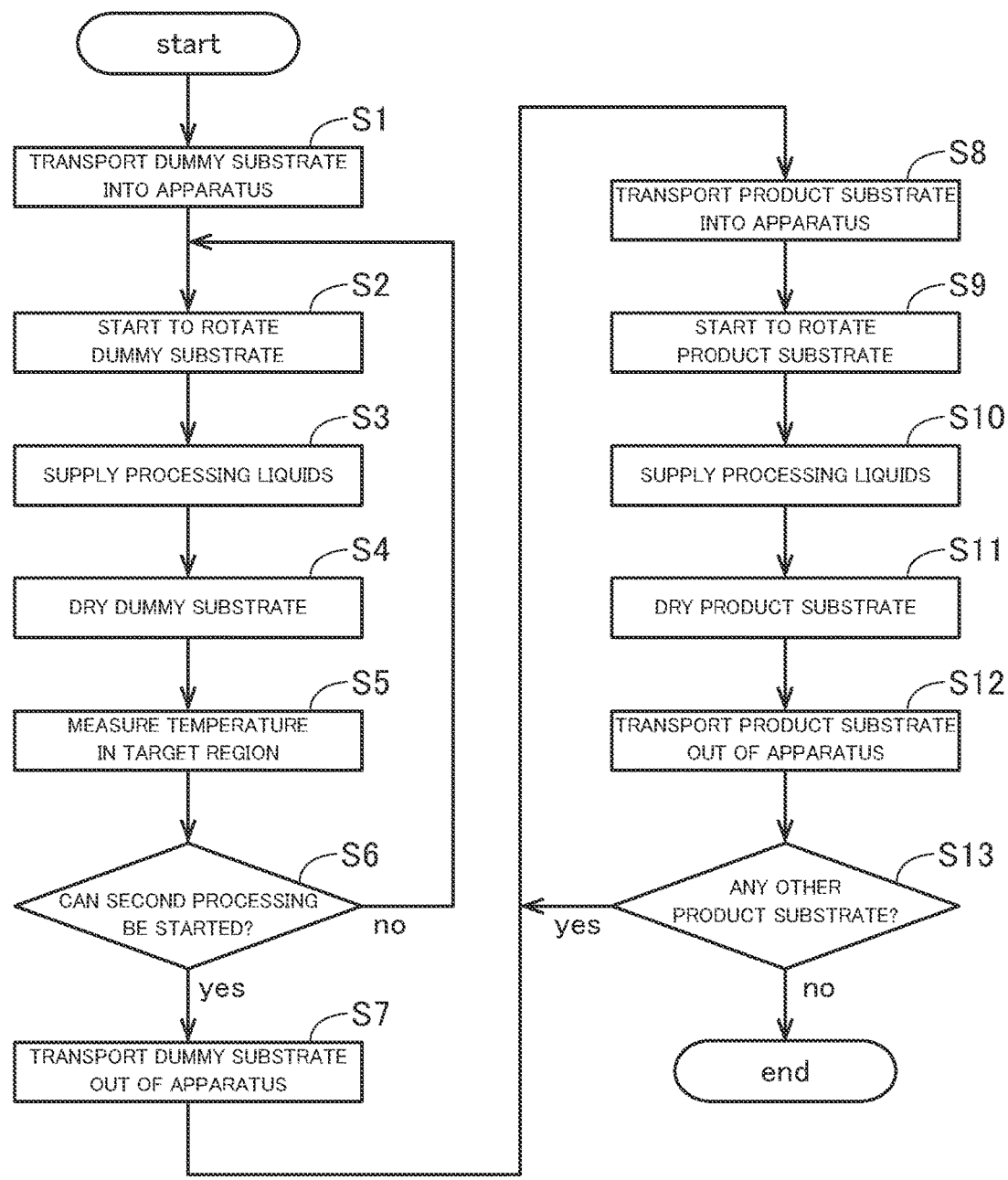
FIG. 7 is a flowchart illustrating a procedure of first processing and second processing according to a first embodiment.

The above-described processing unit 102 performs preliminary processing (hereinafter, referred to as "first processing") for stabilizing temperature environments in the processing unit 102 before performing processing (hereinafter, referred to as "second processing") on a substrate W serving as a product (hereinafter, referred to as a "product substrate Wp"). The following description is given of the procedure of the first processing and the second processing with reference to the flowchart in FIG. 7.

In the present embodiment, first, the main transport robot 103 transports a substrate W for preliminary processing (hereinafter, referred to as a "dummy substrate Wd") that has the same shape and size as the product substrate Wp into the chamber 10 (step S1). The dummy substrate Wd transported into the chamber 10 is held in a horizontal position by the substrate holder 20. Then, the first processing is performed on this dummy substrate Wd (steps S2 to S4).

In the first processing, first, the spin motor 32 of the rotation mechanism 30 is driven so as to cause the dummy substrate Wd to start to rotate (step S2). Specifically, the support shaft 33, the spin base 21, the chuck pins 22, and the dummy substrate Wd held by the chuck pins 22 rotate about the shaft core 330 of the support shaft 33.

Then, processing liquids are supplied from the processing liquid supply part 40 (step S3). In step S3, the nozzle motors 413, 423, and 433 are driven so as to cause the first nozzle head 412, the second nozzle head 422, and the third nozzle head 432 to move sequentially to the processing positions opposing the upper face of the dummy substrate Wd. Then, each of the nozzle heads 412, 422, and 432 ejects a processing liquid at the processing position. The sequence of supply of each processing liquid and the supply time of each processing liquid in the first processing are set in advance in the storage 83 of the controller 80. The controller 80 executes an operation of ejecting a processing liquid from each of the top nozzles 41, 42, and 43 in accordance with this settings.

In step S3, each of the top nozzles 41, 42, and 43 may be oscillated horizontally at the processing position while ejecting a processing liquid. A processing liquid may also be ejected from the bottom nozzle 44 as necessary.

During the step of supplying processing liquids in step S3, the barrier plate 60 is located at the upper position above the top nozzles 41, 42, and 43. When the supply of various processing liquids to the dummy substrate Wd has been completed and all of the top nozzles 41, 42, and 43 have been retracted to the retracted positions, the controller 80 operates the elevating mechanism 61 so as to cause the barrier plate 60 to move from the upper position to the lower position. Then, the number of revolutions of the spin motor 32 is increased to speed up the rotation of the dummy substrate Wd, and a dry gas is blown toward the dummy substrate Wd from the gas outlet 62 provided in the lower face of the barrier plate 60. In this way, the surface of the dummy substrate Wd is dried (step S4).

After the first processing from steps S2 to S4 has been completed, the thermographic camera 70 measures the temperature in the target region A (step S5). Specifically, the thermographic camera 70 detects infrared rays radiated from each member included in the target region A, and on the basis of the result of the detection, acquires the measured temperature information T1 that images the temperature distribution in the target region A. Then, the measured temperature information T1 acquired by the thermographic camera 70 is transmitted from the thermographic camera 70 to the controller 80.

Upon receiving the measured temperature information T1 from the thermographic camera 70, the controller 80 determines whether or not to start the second processing, on the basis of the measured temperature information T1 (step S6). In the storage 83 of the controller 80, reference temperature information T2 (see FIG. 5) that indicates a temperature distribution suitable for the start of the second processing is stored in advance. The controller 80 compares the measured temperature information T1 received from the thermographic camera 70 with this reference temperature information T2. If a difference between the reference temperature information T2 and the measured temperature information T1 is out of tolerance, the controller 80 determines that the second processing cannot be started (no in step S6).

In this case, the aforementioned first processing (steps S2 to S4) is additionally executed in the chamber 10. This allows the temperature distribution in the target region A to approach a temperature distribution suitable for the start of the second processing. Thereafter, the temperature in the target region A is measured again with the thermographic camera 70 (step S5). Then, the controller 80 again determines whether or not to start the second processing on the basis of the acquired measured temperature information T1 (step S6).

In step S6, if the difference between the reference temperature information T2 and the measured temperature information T1 is within the preset tolerance, the controller 80 determines that the second processing can be started (yes in step S6). In this case, the substrate holder 20 releases the hold of the dummy substrate Wd. Then, the main transport robot 103 takes the dummy substrate Wd out of the substrate holder 20 and transports the dummy substrate Wd to the outside of the chamber 10 (step S7).

Following this, the main transport robot 103 transports a product substrate Wp into the chamber 10 (step S8). The product substrate Wp transported into the chamber 10 is held in a horizontal position by the substrate holder 20. Then, the second processing is performed on this product substrate Wp (steps S9 to S11).

In the second processing, first, the spin motor 32 of the rotation mechanism 30 is driven so as to cause the product substrate Wp to start to rotate (step S9). Specifically, the support shaft 33, the spin base 21, the chuck pins 22, and the product substrate Wp held by the chuck pins 22 rotate about the shaft core 330 of the support shaft 33.

Then, processing liquids are supplied from the processing liquid supply part 40 (step S10). In step S10, the nozzle motors 413, 423, and 433 are driven so as to cause the first nozzle head 412, the second nozzle head 422, and the third nozzle head 432 to move sequentially to the processing positions opposing the upper face of the product substrate Wp. Then, each of the nozzle heads 412, 422, and 432 ejects a processing liquid at the processing position. The sequence of supply of each processing liquid and the supply time of each processing liquid in the second processing are set in advance in the storage 83 of the controller 80. The controller 80 executes an operation of ejecting a processing liquid from each of the top nozzles 41, 42, and 43 in accordance with this settings.

In step S10, each of the top nozzles 41, 42, and 43 may be oscillated horizontally at the processing position while ejecting a processing liquid. A processing liquid may also be ejected from the bottom nozzle 44 as necessary.

During the step of supplying processing liquids in step S10, the barrier plate 60 is located at the upper position above the top nozzles 41, 42, and 43. When the supply of various processing liquids to the product substrate Wp has been completed and all of the top nozzles 41, 42, and 43 have been retracted to the retracted positions, the controller 80 operates the elevating mechanism 61 so as to cause the barrier plate 60 to move from the upper position to the lower position. Then, the number of revolutions of the spin motor 32 is increased to speed up the rotation of the product substrate Wp, and a dry gas is blown toward the product substrate Wp from the gas outlet 62 provided in the lower face of the barrier plate 60. In this way, the surface of the product substrate Wp is dried (step S11).

When the second processing on the single product substrate Wp has been completed, the substrate holder 20 releases the hold of the product substrate Wp. Then, the main transport robot 103 takes the product substrate Wp out of the substrate holder 20 and transports the product substrate Wp to the outside of the chamber 10 (step S12).

Thereafter, the controller 80 determines whether there is any other product substrate Wp to be processed (step S13). If there is another product substrate Wp to be processed (yes in step S13), this product substrate Wp is transported into the chamber 10 (step S8). The product substrate Wp transposed into the chamber 10 is held in a horizontal position by the substrate holder 20. Then, the second processing is performed on this product substrate Wp in the same manner as described above (steps S9 to S11).

If no unprocessed product substrates Wp remains, the controller 80 determines that there are no more product substrates Wp to be processed (no in step S13). Thus, the processing unit 102 ends the second processing on a plurality of product substrates Wp.

As described above, in the present embodiment, the temperature of the predetermined target region A in the chamber 10 is measured with the thermographic camera 70 after the first processing on the dummy substrate Wd has been finished. Then, whether or not to start the second processing is determined on the basis of the acquired measured temperature information T1. Thus, it is possible to start the second processing on a product substrate Wp, with the temperature of the target region A in the chamber 10 having reached its stability. Accordingly, the second processing can be performed uniformly on a plurality of product substrates Wp.

In particular, in the present embodiment, the first processing is additionally performed when the temperature in the chamber has not reached the state of being able to start the second processing after the first processing. This allows the temperature environments in the chamber 10 to approach the state of being able to start the second processing.

In the present embodiment, the first processing performed on the dummy substrate Wd and the second processing performed on the product substrate Wp are the same processing. That is, the rotation mechanism 30, the processing liquid supply part 40, and the barrier plate 60 function both as a first processor that performs the first processing on a dummy substrate Wd and as a second processor that performs the second processing on a product substrate Wp. This further stabilizes temperature environments in the chamber 10 because the first processing identical in content to the second processing is performed in advance before execution of the second processing. Alternatively, the first processing may be different from the second processing. For example, the first processing may be processing that omits or shortens part of the second processing. As another alternative, the first processor and the second processor may be separate mechanisms provided in the chamber 10.

2. Second Embodiment

Next, a second embodiment according to the present invention will be described. This second embodiment is identical to the first embodiment in the configuration of the substrate processing apparatus 100 itself, and is also identical to the first embodiment in the procedure of processing, except some steps. A redundant description of the content identical to that of the first embodiment will be omitted below.

Figure 8:
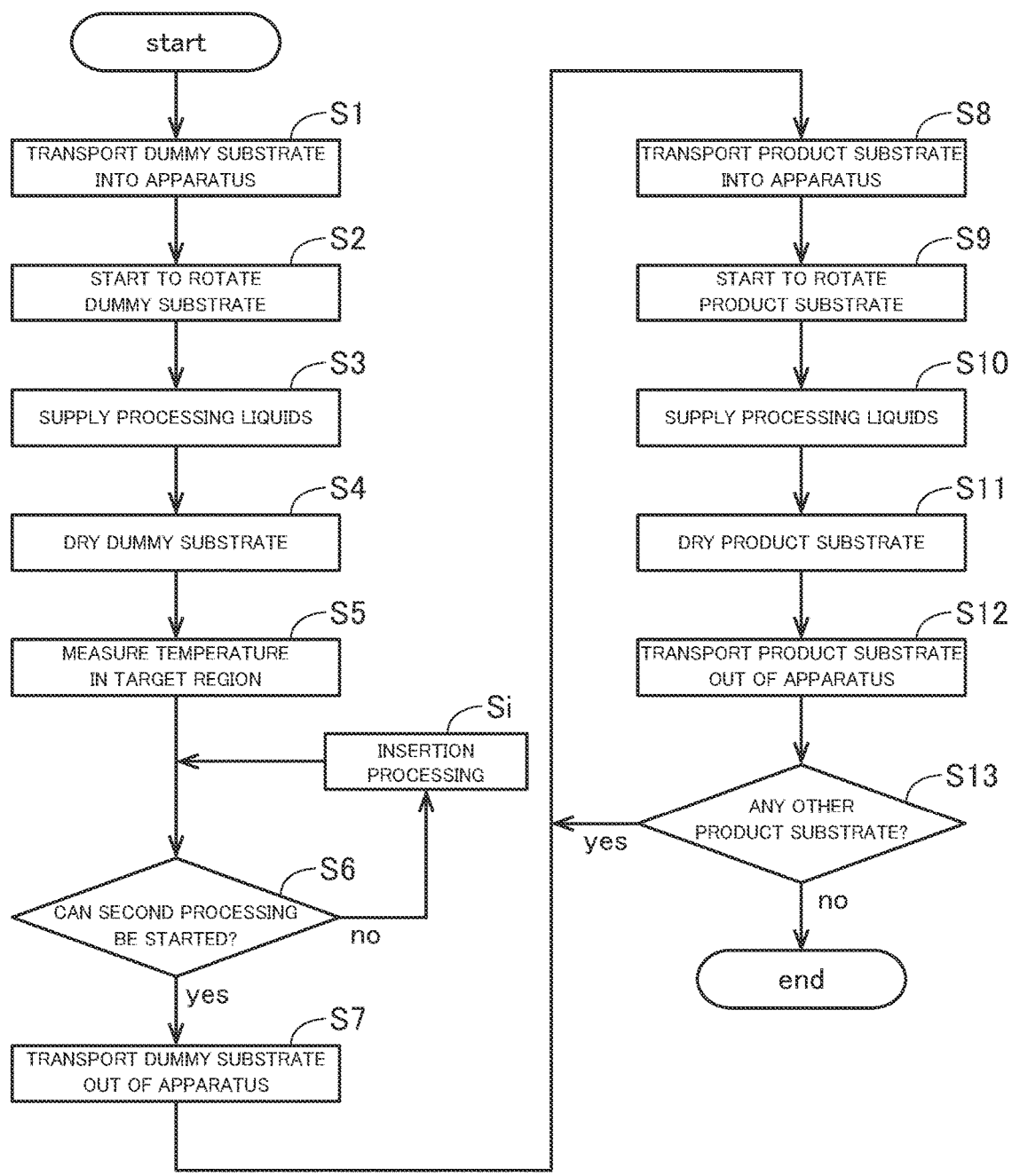
FIG. 8 is a flowchart illustrating a procedure of first processing and second processing according to a second embodiment.

FIG. 8 is a flowchart illustrating a procedure of the first processing and the second processing according to the second embodiment.

In the second embodiment, steps S1 to S6 are performed in the same manner as in the first embodiment. That is, the dummy substrate Wd is first transported into the chamber 10 (step S1). Then, the first processing is performed on the dummy substrate Wd in the chamber 10 (steps S2 to S4). After the first processing has been finished, the temperature in the target region A is measured with the thermographic camera 70 (step S5). Then, the controller 80 determines whether or not to start the second processing, on the basis of the received measured temperature information T1 (step S6).

In step S6, if the difference between the reference temperature information T2 and the measured temperature information T1 is out of tolerance, the controller 80 determines that the second processing cannot be started (no in step S6). In this case, in the present embodiment, insertion processing different from the first processing is performed (step Si), instead of additionally performing the first processing (steps S2 to S4).

The insertion processing is, for example, processing for supplying processing liquids to the upper face of the dummy substrate Wd while rotating the dummy substrate Wd about the shaft core 330. Note that the types of the processing liquids to be supplied, the sequence of supply of each processing liquid, and the supply time of each processing liquid are different from those in the first processing. For example, the insertion processing may only be processing for supplying heated pure water to the upper face of the rotating dummy substrate Wd. This allows the temperature distribution in the target region A to approach a temperature distribution suitable for the start of the second processing.

In the present embodiment, the processing liquid supply part 40 functions as the first processor and the second processor and also functions as an insertion processor that performs the insertion processing. Alternatively, the processing unit 102 may include an insertion processor that performs insertion processing separately from the processing liquid supply part 40.

Thereafter, the temperature in the target region A is measured again with the thermographic camera 70 (step S5).

Then, the controller 80 again determines whether or not to start the second processing, on the basis of the acquired measured temperature information T1 (step S6).

In step S6, if the difference between the reference temperature information T2 and the measured temperature information T1 is within the preset tolerance, the controller 80 determines that the second processing can be started (yes in step S6). In this case, the dummy substrate Wd is transported to the outside of the chamber 10 (step S7). Thereafter, as in the first embodiment, a plurality of product substrates Wp is sequentially transported into the chamber 10 and sequentially subjected to the second processing (steps S8 to S13).

As described above, in the present embodiment as well, the temperature of the predetermined target region A in the chamber 10 is measured with the thermographic camera 70 after the first processing has been performed on the dummy substrate Wd. Then, whether or not to start the second processing is determined on the basis of the acquired measured temperature information T1. Thus, it is possible to start the second processing on the product substrate $W_p$, with the temperature of the target region A in the chamber 10 having reached its stability. Accordingly, the second processing can be performed uniformly on a plurality of product substrates $W_p$.

In particular, in the present embodiment, the insertion processing is performed when the temperature in the chamber has not reached the state of being able to start the second processing after the first processing. This allows temperature environments in the chamber 10 to approach the state of being able to start the second processing. If the insertion processing is more simplified than the first processing, it is possible to shorten the time required for the insertion processing and to reduce the amount of processing liquids consumed.

3. Variations

While embodiments of the present invention have been described thus far, the present invention is not intended to be limited to the embodiments described above.

In the above-described embodiments, the temperature in the target region A is measured after the first processing has been finished. However, the temperature in the target region A may be measured at any time during the first processing. The controller 80 may determine, during execution of the first processing, whether or not to start the second processing, on the basis of the measured temperature information T1 acquired from the thermographic camera 70. In the case of performing the insertion processing, the temperature in the target region A may be measured at any time during execution of the insertion processing. Then, the controller 80 may determine, during execution of the insertion processing, whether or not to start the second processing, on the basis of the measured temperature information T1 acquired from the thermographic camera 70.

Figure 9:
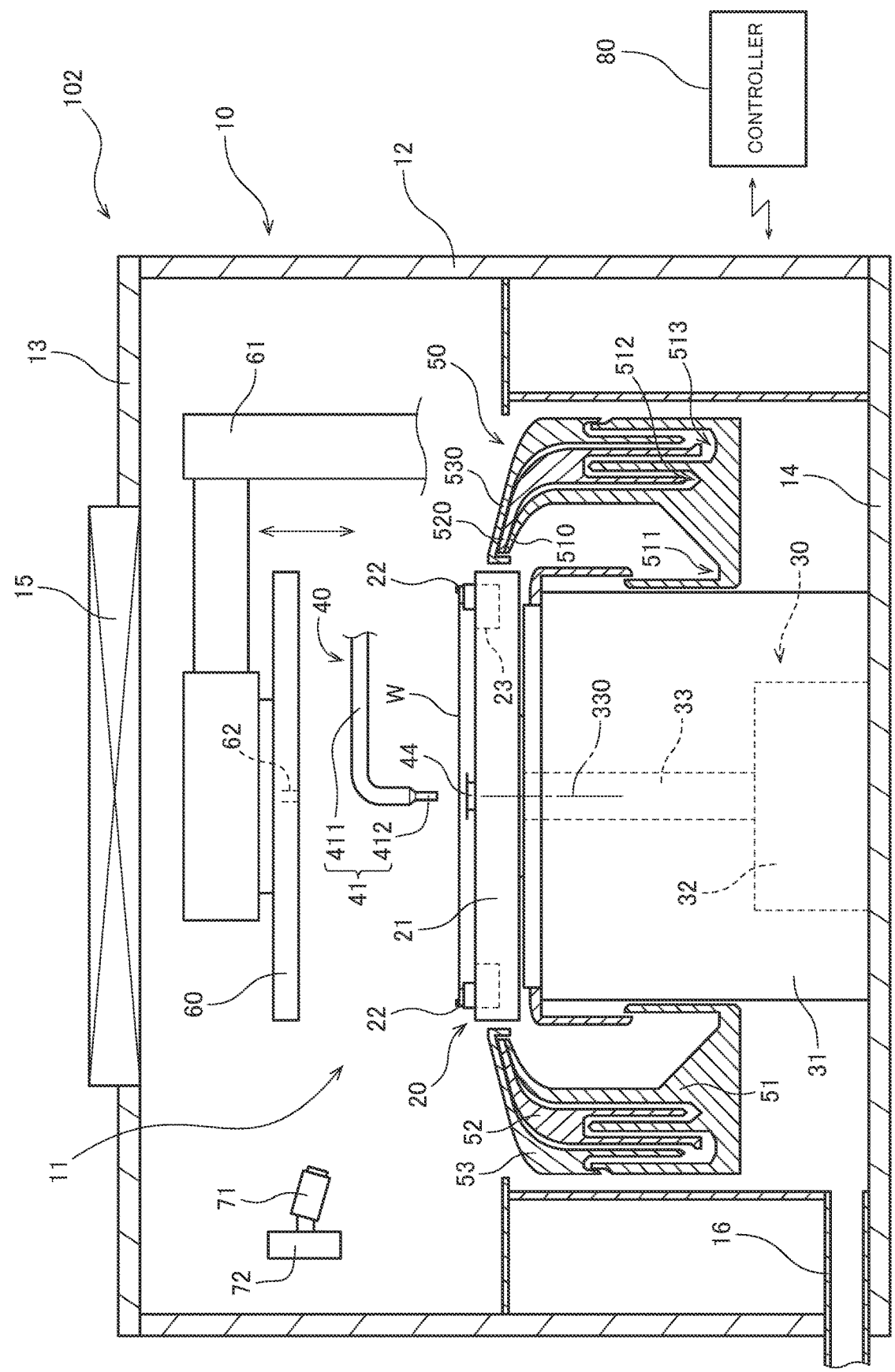
FIG. 9 is a longitudinal sectional view of a processing unit according to a variation.

In the above-described embodiments, the thermographic camera 70 is used as a first temperature measurement part. Alternatively, a radiation thermometer may be used as the first measurement part. FIG. 9 is a longitudinal sectional view of a processing unit 102 in the case of using a radiation thermometer 71. In the example in FIG. 9, the radiation thermometer 71 is connected to an oscillating mechanism 72. When the oscillating mechanism 72 is operated, the orientation of the radiation thermometer 71 is changed. The radiation thermometer 71 measures the temperature in the target region A and acquires the measured temperature information T1 while having its orientation changed by the oscillating mechanism 72. The acquired measured temperature information T1 is transmitted from the radiation thermometer 71 to the controller 80.

In general, the area that can be measured with the radiation thermometer 71 is narrower than the area that can be measured with the thermographic camera 70. However, the oscillating mechanism 72 as illustrated in FIG. 9 allows the radiation thermometer 71 to measure the temperature in a wide target region A.

Figure 10:
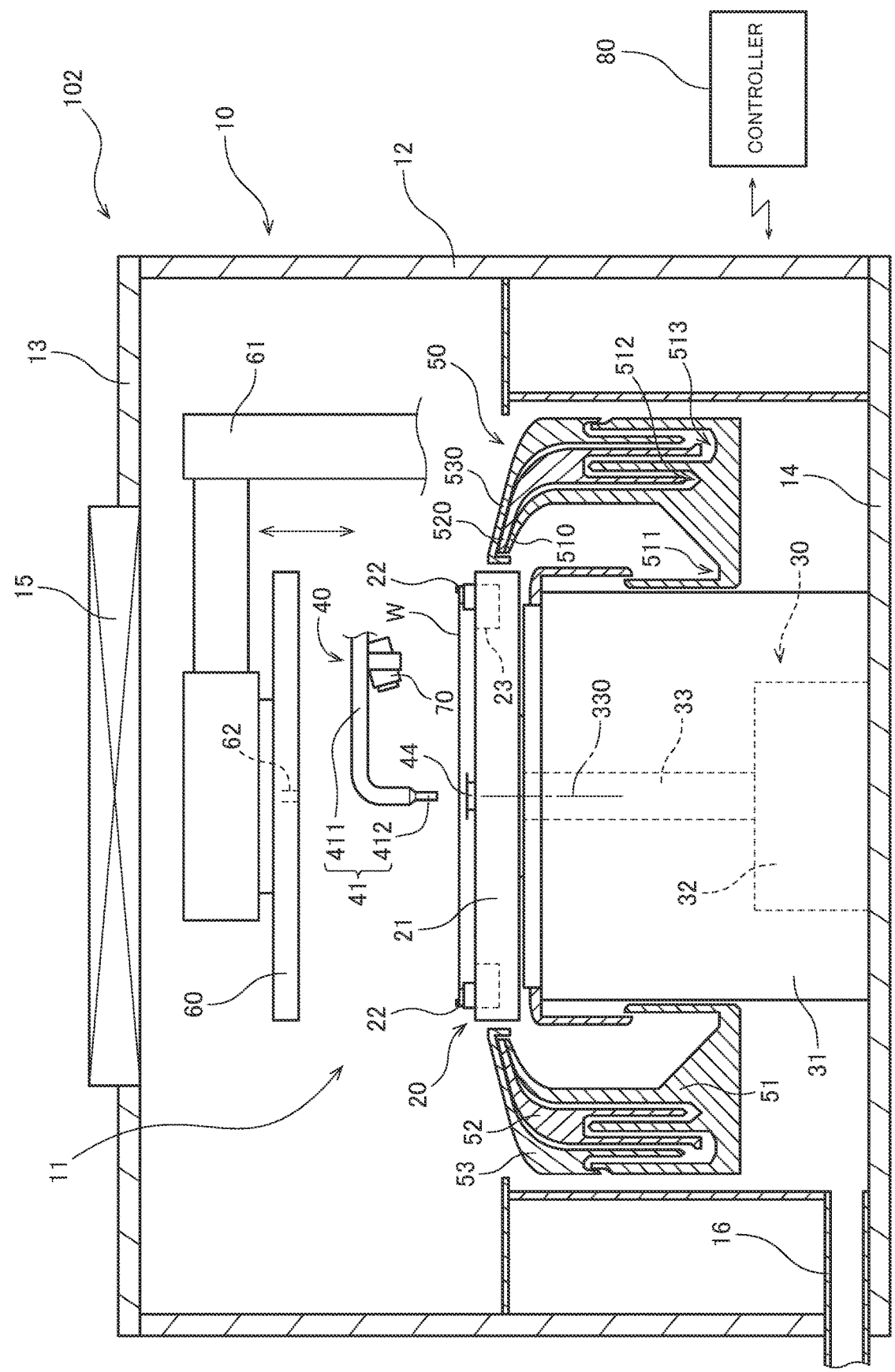
FIG. 10 is a longitudinal sectional view of a processing unit according to a variation.

Alternatively, the radiation thermometer 71 may be mounted on the first nozzle arm 411 as illustrated in FIG. 10. Similarly, the radiation thermometer 71 may also be mounted on the second nozzle arm 421 and the third nozzle arm 431. In this case, each radiation thermometer 71 can be oscillated with the help of turning motion of the nozzle arms 411, 421, and 431. Accordingly, there is no need to provide an oscillating mechanism separately from the nozzle arms 411, 421, and 431.

Figure 11:
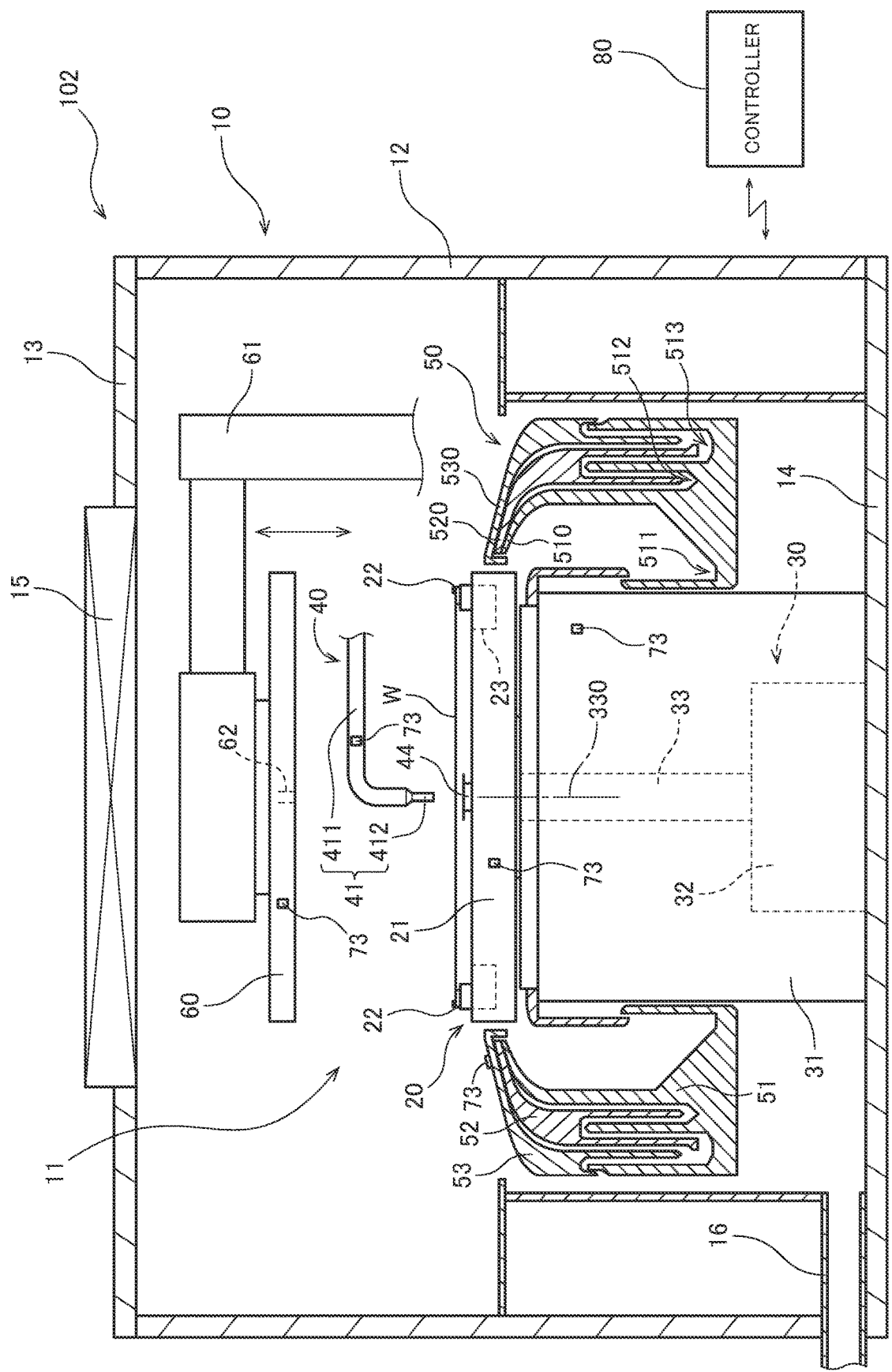
FIG. 11 is a longitudinal sectional view of a processing unit according to a variation.

As another alternative, a thermocouple may be used as the first measurement part. FIG. 11 is a sectional view of a processing unit 102 in the case of using thermocouples 73. In the example in FIG. 11, a thermocouple 73 is disposed on the surface of each member included in the target region A. Each thermocouple 73 measures the temperature on the surface of the member and acquires the measured temperature information T1. The acquired measured temperature information T1 is transmitted from the thermocouple 73 to the controller 80. The controller 80 may determine whether or not to start the second processing, on the basis of an evaluation value that is calculated by multiplying the measured temperature information T1 acquired from each thermocouple 73 by a coefficient that corresponds to the magnitude of the effect on a substrate W and adding the results of the multiplication.

Figure 12:
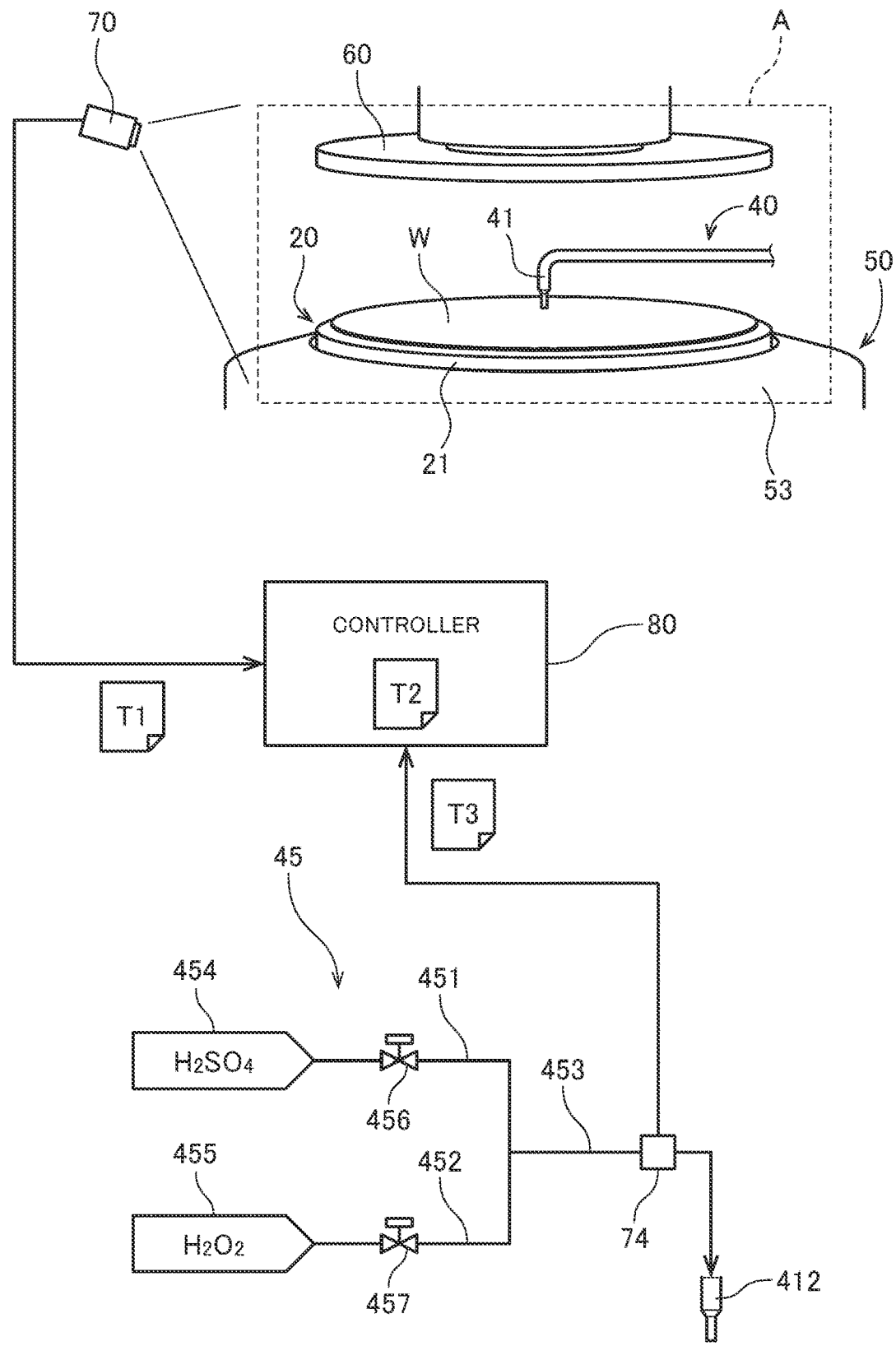
FIG. 12 is a diagram schematically illustrating a temperature measurement using a thermographic camera and a liquid temperature sensor.

The processing unit 102 may further include a second measurement part that measures the temperature of a processing liquid in piping, separately from the first measurement part. For example, a liquid temperature sensor 74 serving as the second measurement part may be provided in the path of the junction piping 453 connected to the first nozzle head 412, as illsutrated in FIG. 12. The liquid temperature sensor 74 measures the temperature of the processing liquid flowing through the junction piping 453 (in the example in FIG. 12, the SPM cleaning liquid) and acquires measured temperature information T3. The acquired measured temperature information T3 is transmitted from the liquid temperature sensor 74 to the controller 80.

In this case, the controller 80 determines whether or not to start the second processing on the basis of the measured temperature information T1 acquired from the thermographic camera 70 and the measured temperature information T3 acquired from the liquid temperature sensor 74. For example, the controller 80 compares the measured temperature information T1 and the measured temperature information T3 with the reference temperature information T2 stored in advance in the controller 80. If both of the measured temperature information T1 and the measured temperature information T3 fall within preset tolerance, the controller 80 determines that the second processing can be started. Accordingly, whether or not to start the second processing can be determined with higher precision.

In the above-described embodiments, the first processing is performed on the dummy substrate Wd. Alternatively, the first processing may be processing that is performed without using the dummy substrate Wd. For example, the first processing may be processing for supplying a processing liquid directly to the spin base 21 of the substrate holder 20. As another alternative, the first processing may be processing for ejecting a processing liquid to a predetermined container from each of the nozzle heads 412, 422, and 432 at the retracted position. Similarly, the insertion processing may also be processing that is performed without using the dummy substrate Wd. The first processing and the insertion processing may also be processing that is performed on the product substrate Wp before the second processing.

In the above-described embodiments, the substrates W to be processed are silicon wafers for semiconductors. However, the substrates to be processed in the present invention are not limited to silicon wafers. The substrates to be processed in the present invention may be substrates for other precision electronic devices, such as glass substrates for flat panel displays including liquid crystal displays, glass substrates for photomasks, or glass substrates for solar cells.

The shapes of the details of the substrate processing apparatus may be different from those illustrated in the drawings of the present application. Constituent elements described above in the embodiments and the variations may be appropriately combined within a range that causes no contradictions.

REFERENCE SIGNS LIST

10 Chamber
11 Processing space
12 Side wall
13 Top plate
14 Base plate
20 Substrate holder
21 Spin base
22 Chuck pin
23 Chuck pin switching mechanism
30 Rotation mechanism
31 Motor cover
32 Spin motor
33 Support shaft
40 Processing liquid supply part
41, 42, 43, 44 Top nozzle
45 Liquid supply part
50 Processing liquid collector
51 Inner cup
52 Intermediate cup
53 Outer cup
60 Barrier plate
61 Elevating mechanism
70 Thermographic camera
71 Radiation thermometer
72 Oscillating mechanism
73 Thermocouple
74 Liquid temperature sensor
80 Controller
100 Substrate processing apparatus
101 Indexer
102 Processing unit
103 Main transport robot
A Target region
T1 Measured temperature information
T2 Reference temperature information
T3 Measured temperature information
W Substrate

The invention claimed is:
1. A substrate processing apparatus comprising:
a chamber;

a substrate holder that holds a substrate in said chamber;
a processing liquid supply part that supplies a processing liquid to a substrate held by said substrate holder in said chamber;
a first temperature measurement part that measures a temperature of a predetermined target region in said chamber; and
a controller that controls said processing liquid supply part,
wherein said controller performs first processing for stabilizing a temperature environment in said chamber and determines whether or not to start a second processing that is performed by said liquid processing supply part, in accordance with measured temperature information acquired from said first temperature measurement part during or after said first processing.

2. The substrate processing apparatus according to claim 1, wherein
said controller determines whether or not to start said second processing in accordance with said measured temperature information and reference temperature information stored in said controller.

3. The substrate processing apparatus according to claim 1, wherein
when having determined after said first processing that said second processing cannot be started, said controller additionally performs said first processing and again determines whether or not to start said second processing, in accordance with measured temperature information acquired from said first temperature measurement part during or after said first processing that is additionally performed.

4. The substrate processing apparatus according to claim 1, wherein
when having determined after said first processing that said second processing cannot be started, said controller performs an insertion processing different from said first processing and again determines whether or not to start said second processing, in accordance with measured temperature information acquired from said first temperature measurement part during or after said insertion processing.

5. The substrate processing apparatus according to claim 1, wherein
said target region includes two or more parts that play different roles in said chamber.

6. The substrate processing apparatus according to claim 1, wherein
said target region includes at least part of said substrate holder.

7. The substrate processing apparatus according to claim 1, wherein
said target region includes at least part of said processing liquid supply part.

8. The substrate processing apparatus according to claim 1, further comprising:
a ring-shaped cup that surrounds said substrate holder,
wherein said target region includes at least part of said cup.

9. The substrate processing apparatus according to claim 1, wherein
said processing liquid supply part includes a nozzle that ejects a processing liquid toward a substrate, and
said target region includes a liquid column of the processing liquid ejected from said nozzle.

10. The substrate processing apparatus according to claim 9, further comprising:
a second temperature measurement part that measures a temperature of a processing liquid supplied to said nozzle in piping,
wherein said controller determines whether or not to start said second processing, in accordance with the measured temperature information acquired from said first temperature measurement part and measured temperature information acquired from said second temperature measurement part.

11. The substrate processing apparatus according to claim 1, wherein
said first processing is the same processing as said second processing and is performed on a dummy substrate that has the same shape as a substrate that is subjected to said second processing.

12. The substrate processing apparatus according to claim 1, wherein
said first temperature measurement part is a thermographic camera.

13. The substrate processing apparatus according to claim 1, wherein
said first temperature measurement part includes:
a radiation thermometer; and
an oscillating mechanism that changes an orientation of said radiation thermometer.

14. The substrate processing apparatus according to claim 1, wherein
said first temperature measurement part is a thermocouple disposed in said target region.

15. A substrate processing method for processing a substrate in a chamber, the method comprising the steps of:
a) performing a first processing for stabilizing a temperature environment in the chamber;
b) measuring a temperature of a predetermined target region in said chamber during or after said first processing;
c) determining whether or not to start a second processing for supplying a processing liquid to a substrate, in accordance with said measured temperature acquired in said step b); and
d) when it is determined in said step c) that said second processing can be started, performing said second processing.

16. The substrate processing method according to claim 15, wherein
in said step c), whether or not to start said second processing is determined in accordance with said measured temperature and in accordance with reference temperature information stored in advance.

* * * * *